United States Patent
Kuo et al.

(10) Patent No.: US 10,366,965 B2
(45) Date of Patent: Jul. 30, 2019

(54) CHIP BONDING APPARATUS, CHIP BONDING METHOD AND A CHIP PACKAGE STRUCTURE

(71) Applicants: Industrial Technology Research Institute, Hsinchu (TW); Intellectual Property Innovation Corporation, Hsinchu (TW)

(72) Inventors: Shu-Wei Kuo, Hsinchu County (TW); Wei-Yuan Cheng, Hsinchu County (TW); Shau-Fei Cheng, Pingtung County (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/856,065

(22) Filed: Dec. 28, 2017

(65) Prior Publication Data
US 2019/0131271 A1    May 2, 2019

(30) Foreign Application Priority Data

Oct. 30, 2017   (TW) .............................. 106137307 A

(51) Int. Cl.
*H01L 23/495*   (2006.01)
*H01L 23/00*    (2006.01)
(Continued)

(52) U.S. Cl.
CPC .......... *H01L 24/75* (2013.01); *H01L 21/4853* (2013.01); *H01L 21/67144* (2013.01);
(Continued)

(58) Field of Classification Search
USPC ........ 257/77, 778, 782, 668; 439/46, 64, 79, 439/84, 940, 41; 438/125, 15, 64, 67,
(Continued)

(56) References Cited

U.S. PATENT DOCUMENTS

| 4,733,462 A | 3/1988 | Kawatani |
| 5,290,134 A | 3/1994 | Baba |

(Continued)

FOREIGN PATENT DOCUMENTS

| CN | 101859872 | 7/2012 |
| TW | 452191 | 8/2001 |

(Continued)

OTHER PUBLICATIONS

"Office Action of Taiwan Counterpart Application," dated Jan. 16, 2019, p. 1-p. 4.

*Primary Examiner* — Niki H Nguyen
(74) *Attorney, Agent, or Firm* — JCIPRNET

(57) ABSTRACT

A chip bonding apparatus for bonding a chip and a redistribution structure with each other is provided. The chip bonding apparatus includes a pick and place module and an alignment module. The pick and place module is suitable for picking up and placing the chip. The alignment module is movably connected to the pick and place module. The alignment module includes at least one alignment protrusion, wherein the at least one alignment protrusion extends toward at least one alignment socket included in the redistribution structure. Furthermore, a chip bonding method and a chip package structure are provided.

18 Claims, 10 Drawing Sheets

(51) Int. Cl.
  *H01L 23/498* (2006.01)
  *H01L 23/544* (2006.01)
  *H01L 21/67* (2006.01)
  *H01L 21/48* (2006.01)
  *H01L 23/31* (2006.01)

(52) U.S. Cl.
  CPC .... *H01L 23/3185* (2013.01); *H01L 23/49822* (2013.01); *H01L 23/49838* (2013.01); *H01L 23/544* (2013.01); *H01L 24/16* (2013.01); *H01L 24/81* (2013.01); *H01L 2223/54426* (2013.01); *H01L 2224/16165* (2013.01); *H01L 2224/75753* (2013.01); *H01L 2224/75756* (2013.01); *H01L 2224/81121* (2013.01); *H01L 2224/81136* (2013.01)

(58) Field of Classification Search
  USPC ................ 438/455–456, 112, 120, 106–108
  See application file for complete search history.

(56) References Cited

U.S. PATENT DOCUMENTS

| | | | |
|---|---|---|---|
| 6,991,960 | B2* | 1/2006 | Howarth ............ H01L 23/3128 |
| | | | 257/777 |
| 7,333,683 | B2 | 2/2008 | Sasaki et al. |
| 9,541,716 | B2 | 1/2017 | Ji et al. |
| 2006/0078248 | A1 | 4/2006 | Sasaki et al. |
| 2016/0315067 | A1* | 10/2016 | Chou ................. H01L 25/0657 |
| 2017/0098628 | A1* | 4/2017 | Liu ...................... H01L 21/568 |
| 2017/0148771 | A1 | 5/2017 | Cha et al. |

FOREIGN PATENT DOCUMENTS

| | | |
|---|---|---|
| TW | 201126671 | 8/2011 |
| TW | M472310 | 2/2014 |
| TW | 201425207 | 7/2014 |
| TW | I466259 | 12/2014 |
| TW | 201737447 | 10/2017 |

* cited by examiner

CHIP BONDING APPARATUS, CHIP BONDING METHOD AND A CHIP PACKAGE STRUCTURE

CROSS-REFERENCE TO RELATED APPLICATION

This application claims the priority benefit of Taiwan application serial no. 106137307, filed on Oct. 30, 2017. The entirety of the above-mentioned patent application is hereby incorporated by reference herein and made a part of this specification.

BACKGROUND

Technical Field

The disclosure relates to a chip bonding apparatus, a chip bonding method and a chip package structure.

Description of Related Art

Nowadays, as in a highly informative society, the market for a variety of electronic devices has continued to expand rapidly. The chip package technology has also been developed according to the trends of digitization, networking, regional connectivity, and user-friendliness of electronic devices. To meet the requirements above, it is necessary to improve standards, such as high-speed processing, multi-functionality, integration, small in size, lightweight, and low-cost of electronic elements. Therefore, the chip package technology has developed toward the trend of micronization and high density. Flip-chip bonding technology is the combination of a bump and a circuit substrate. Compared with the known wire bonding method, the wiring length forming via the flip-chip bonding method has been greatly shortened, which helps speed up the signal transmission between a chip and a carrier, and has thus become the mainstream of high-density packaging.

In general, in the flip-chip bonding manufacturing process, the optical alignment is mainly carried out by a fiducial mark on a circuit substrate. However, a chip having high number of pins or high density arrangement needs higher alignment accuracy. Therefore, how to further improve the alignment accuracy of the flip-chip bonding manufacturing process, and thus enhance product yield has become an urgent issue to be solved.

SUMMARY

The chip bonding apparatus of an embodiment of the disclosure is suitable for bonding a chip and a redistribution structure with each other. The chip bonding apparatus includes a pick and place module and an alignment module. The pick and place module is suitable for picking up and placing the chip. The alignment module is movably connected to the pick and place module. The alignment module includes at least one alignment protrusion, wherein the at least one alignment protrusion extends toward at least one alignment socket included in the redistribution structure.

An embodiment of the disclosure provides a chip bonding method including the following steps. Provide the aforementioned chip bonding apparatus. Pick up a chip with a pick and place module of the chip bonding apparatus. Move the chip bonding apparatus to the above of a redistribution structure so that the picked-up chip has a spacing interval with the redistribution structure. Align at least one alignment protrusion with at least one alignment socket of the redistribution structure. Move the pick and place module of the chip toward the redistribution structure so that the chip and the redistribution structure electrically connect with each other.

An embodiment of the chip package structure includes a chip, a redistribution structure, an underfill, and an encapsulant. The redistribution structure electrically connects to the chip. The redistribution structure includes at least one socket not overlapping with the chip. The underfill is disposed between the chip and the redistribution structure. The encapsulant encapsulates the chip, the redistribution structure, and the underfill, wherein at least one of the encapsulant and the underfill fills in the at least one socket.

An embodiment of the chip package structure includes a chip, a redistribution structure, an underfill, and an encapsulant. The redistribution structure electrically connects to the chip, and the redistribution structure includes at least one orientation recognition mark. The underfill is disposed between the chip and the redistribution structure. The encapsulant encapsulates the chip, the redistribution structure, and the underfill, wherein at least one of the encapsulant and the underfill encapsulates the at least one orientation recognition mark.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
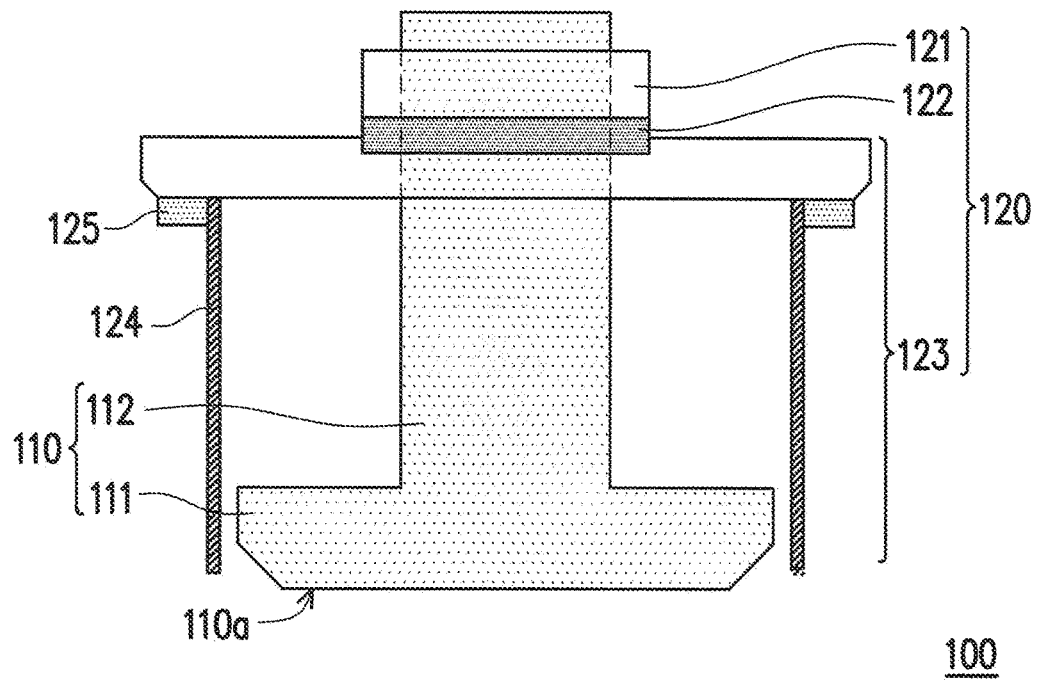
FIG. 1A is a schematic side view illustrating a chip bonding apparatus according to the first embodiment of the disclosure.
Figure 1B:
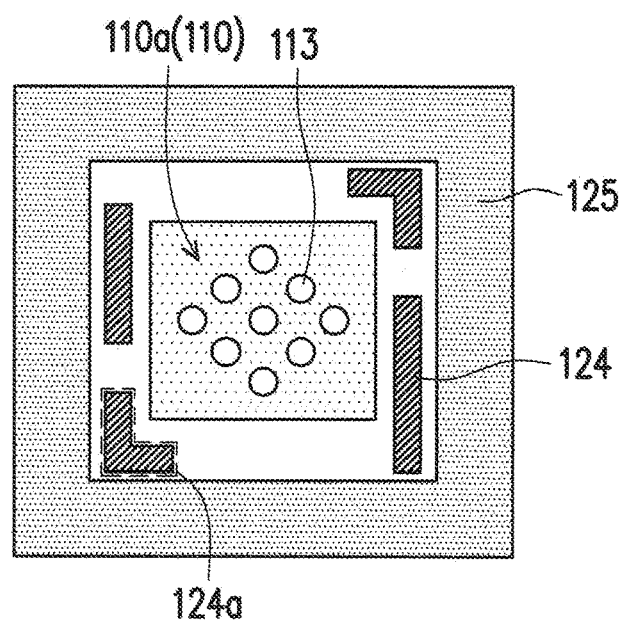
FIG. 1B is a schematic bottom view illustrating the chip bonding apparatus of FIG. 1A.

FIG. 1A is a schematic side view illustrating a chip bonding apparatus according to an exemplary of the first embodiment of the disclosure. FIG. 1B is a schematic bottom view illustrating the chip bonding apparatus of FIG. 1A. A chip bonding apparatus 100, including a pick and place module 110 and an alignment module 120, is suitable for bonding a chip 210 (illustrated in FIG. 2A) and a redistribution structure 220 (illustrated in FIG. 2B) with each other. In the bonding process of the chip 210 and the redistribution structure 220, the chip 210 aligns to the desired bonding area with the redistribution structure 220 via the chip bonding apparatus 100. The detailed chip bonding methods are described in the following paragraphs.

The pick and place module 110 includes a pick and place part 111 and an axial part 112 connecting with each other. The axial part 112 connects with the alignment module 120, and makes the alignment module 120 slip up and down along the axial part 112. As illustrated in FIG. 1B, the pick and place surface 110a of the pick and place part 111 relative to the axial part 112 has a plurality of vents 113. The pick and place module 110 exhausts the vent 113 in the process of picking or moving the chip 210 so that the gas pressure inside the vent 113 is lower than the ambient pressure, and the chip 210 is thus sucked and fixed onto the pick and place surface 110a of the pick and place part 111. In the process of placing the chip 210, ventilate the vent 113 so that the atmospheric pressure inside the vent 113 is greater than or equal to the ambient pressure. After being placed onto the desired placing area (e.g. onto the corresponding redistribution structure 220), the chip 210 is separated from the pick and place part 111. In some embodiments, the vent 113 may also purge air to maintain cleanliness in the chip 210 bonding process.

The alignment module 120 includes a slip structure 121, a force sensor 122, and an alignment structure 123. The slip structure 121, for example, moveably connects to a clutch, a reel, or a slip gear of the axial part 112 so that after the alignment module 120 slips to the predetermined location along the extension direction of the axial part 112, the alignment module 120 is fixed onto the axial part 112. The force sensor 122 is configured between the slip structure 121 and the alignment structure 123. The force sensor 122 includes piezoelectric materials, a strain gauge, and similar force sensors alike to receive an external force in the alignment process of the alignment module 120 and to output corresponding sensing signal after receiving the external force. The alignment structure 123 includes at least one of an alignment protrusion 124, wherein the protrusion direction of the alignment protrusion 124 is the same as the facing direction of the pick and place surface 110a. In this way, the alignment structure 123 aligns by the protruding alignment protrusion 124 while placing the chip 210 to improve the alignment accuracy of the chip 210 and to further enhance the yield of the chip bonding.

In this embodiment, the alignment protrusion 124 is a plurality of protruding structures separating from each other, and the disclosure is not limited thereto. In other embodiments, the alignment protrusion 124 may be an annular protrusion structure surrounding the pick and place module 110.

In this embodiment, the alignment protrusion 124 is configured in a non-point symmetry manner. For instance, as illustrated in FIG. 1B, on a virtual plane (e.g. paper plane) parallel to the pick and place surface 110a, a corresponding pattern of the alignment protrusion 124 does not have a symmetric point. In this way, the orientation recognition is carried out while placing the chip 210 to reduce the possibility of dislocation, inversion or turning while placing the chip 210.

In some embodiments, the alignment protrusion 124 may include a folding foot part 124a similar to L-shaped to reduce the possibility of relatively rotation produced between the chip 210 picked up by the pick and place module 110 and the redistribution structure 220 while placing the chip 210.

In this embodiment, the alignment structure 123 further includes at least one optical sensor 125 surrounding the alignment protrusion 124. The optical sensor 125 is a proximity sensor composed of, for example, a charge-coupled device (CCD), a complementary metal-oxide semiconductor (CMOS) or other suitable photosensitive elements. Before placing the chip 210, the optical sensor 125 optical (e.g. laser or infrared light) scans or optical detects to confirm the location of the chip 210. Or, while placing the chip 210, by optical scanning or optical detection, the location of the chip 210 is modified or adjusted at the same time.

FIG. 2A, FIG. 2B, and FIG. 2D to FIG. 2H are cross-sectional schematic views illustrating a chip bonding method according to the exemplary of the first embodiment of the disclosure. FIG. 2C is a schematic top view of the redistribution structure of the chip bonding method of FIG. 2B. It is noted that the chip bonding method of the disclosure is carried out by the chip bonding apparatus illustrated in FIG. 1A and FIG. 1B. Therefore, the same reference numerals represent the similar structures and have similar functions, and the same technical content is omitted from explanation.

The chip bonding method includes the following steps. First, provides a chip bonding apparatus 100. In this embodiment, the chip bonding process may be performed by the chip bonding apparatus 100 illustrated in FIG. 1A, and the disclosure is not limited thereto. In other embodiments, the chip bonding process may be performed by similar chip bonding apparatus.

Figure 2A:
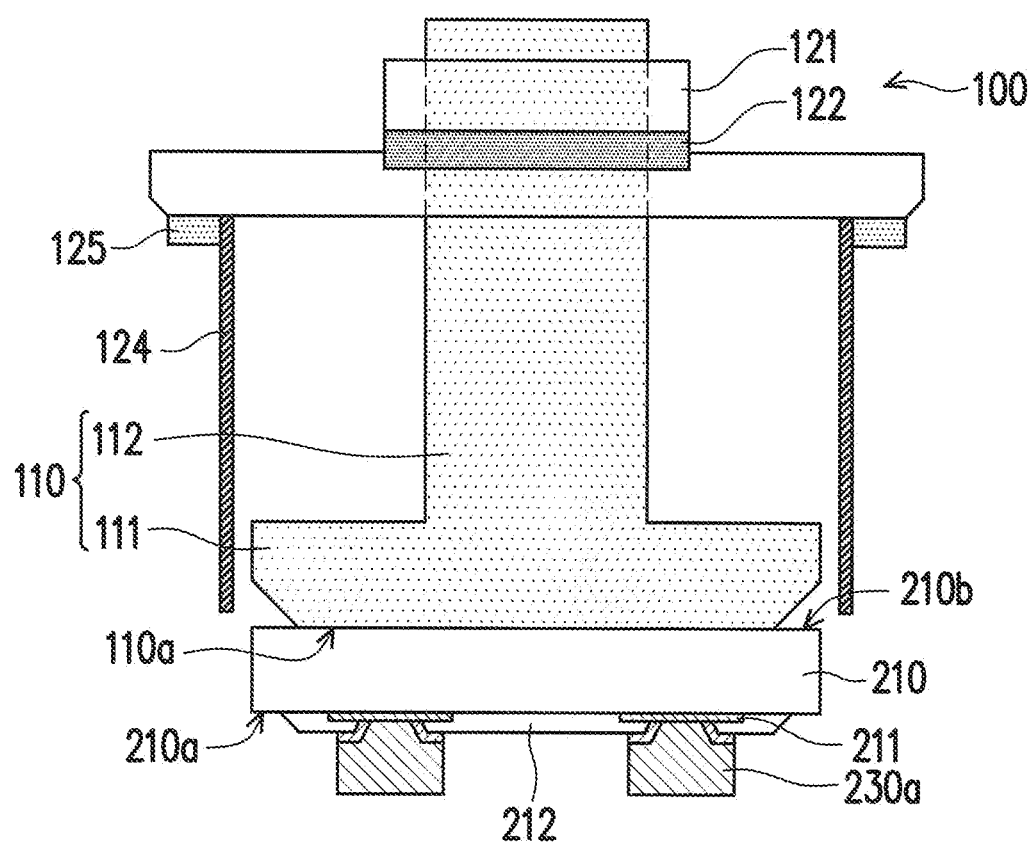
FIG. 2A, FIG. 2B, and FIG. 2D to FIG. 2H are cross-sectional schematic views illustrating a chip bonding method according to the exemplary of the first embodiment of the disclosure.

Then, please refer to FIG. 2A. The pick and place module 110 of the chip bonding apparatus 100 picks up the chip 210.

In this embodiment, the chip 210 has an active surface 210a and a backside surface 210b facing each other. The active surface 210a of the chip 210 includes a contact pad 211, a passivation layer 212, and a first conductive terminal 230a. The contact pad 211 is, for example, an aluminum pad, a copper pad, or other suitable metal pads. The material of the passivation layer 212 is such as silicon oxide, silicon nitride, or other suitable insulation, water block, and/or air block materials. The first conductive terminal 230a is a conductive pillar, a conductive bump, a solder or the combination of the above. The first conductive terminal 230a is disposed on the opening of the passivation layer 212, and electrically connects with the interconnect of the chip 210 by the contact pad 211.

In this embodiment, the chip bonding apparatus 100 first moves onto the above of the backside surface 210b of the chip 210. Then, exhausts the vent 113 (as illustrated in FIG. 1B) so that the air pressure inside the vent 113 is lower than the ambient pressure, the pick and place surface 110a of the pick and place part 111 and the backside surface 210b of the chip 210 contact with each other. The chip 210 can be fixed onto the pick and place surface 110a of the pick and place part 111.

Figure 2B:
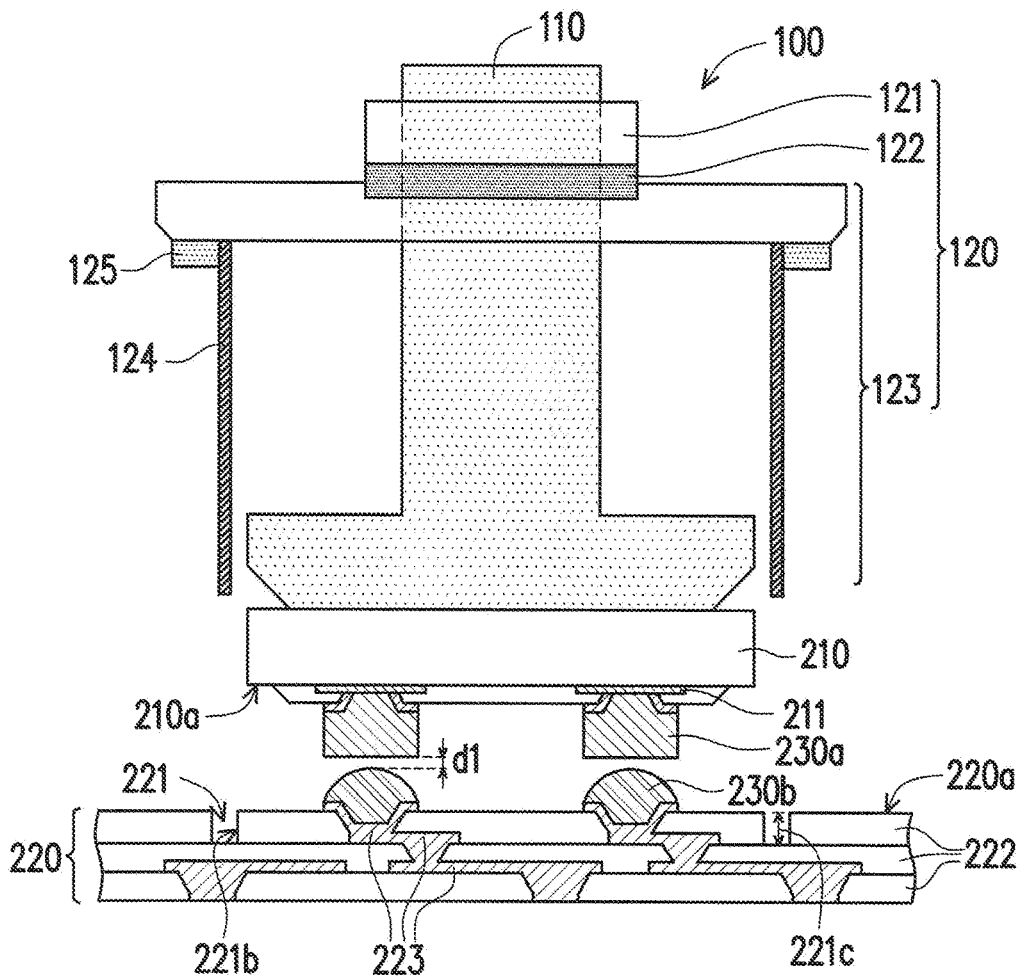
Figure 2C:
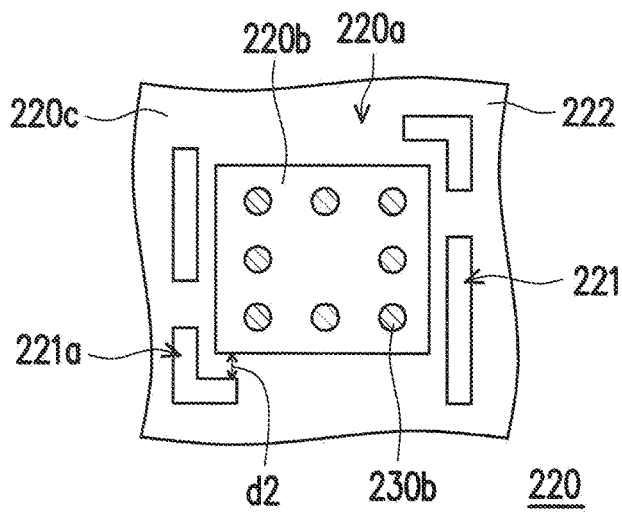
FIG. 2C is a schematic top view illustrating a redistribution structure of the chip bonding method of FIG. 2B.

After that, please refer to FIG. 2B. After the chip 210 is picked up by the pick and place module 110 of the chip bonding apparatus 100, move the chip bonding apparatus 100 after picking up the chip 210 onto the above of the redistribution structure 220. There is a first spacing interval d1 between the chip 210 picked up by the pick and place module 110 and the redistribution structure 220 to avoid the chip 210 contacting with the redistribution structure 220 before alignment, and reduce the possibility of damage caused by unexpected contact between the chip 210 and/or the redistribution structure 220. In the flip-chip bonding process, the first spacing interval d1 generally refers to the shortest distance between the closest component of the redistribution structure 220 on the chip 210 (e.g. the first conductive terminal 230a on the chip 210) and the component on the redistribution structure 220 closest to the chip 210 (e.g. a second conductive terminal 230b on the redistribution structure 220).

Please refer both FIG. 2B and FIG. 2C at the same time. A chip bonding area 220a of the redistribution structure 220 has a chip bonding area 220b and an aligning area 220c surrounding the chip bonding area 220b.

In this embodiment, the redistribution structure 220 includes at least one alignment socket 221, a plurality of dielectric layers 222, a plurality of conductive layers 223, and a plurality of the second conductive terminals 230b. The conductive layer 223 and the dielectric layer 222 stack interactively with each other. The different conductive layers 223 electrically connect with each other by a through via in the dielectric layer 222. The second conductive terminal 230b is disposed onto the chip connecting surface 220a and inside the chip bonding area 220b. The alignment socket 221 is located inside the aligning area 220c and recess inwardly from the surface of the dielectric layer 222. The alignment socket 221 is a blind via and/or a trench not penetrating through the redistribution structure 220, and the alignment socket 221 does not expose any conductive element that is used to transmit signals inside the redistribution structure 220 (for example, the conductive later 223 and/or the through via applied to signal transmission).

In this embodiment, the alignment socket 221 of the redistribution structure 220 is correspondingly distributed with the alignment protrusion 124 of the alignment module 120. That is, the alignment socket 221 may not only be a plurality of blind vias and/or sockets separating from each other, but also be an annular trench surrounding the chip bonding area 220b. In addition, the alignment socket 221 is configured in a non-point symmetry manner. In other words, the alignment socket 221 is served as the orientation recognition mark, which is applied to orientation recognition. Besides, the alignment socket 221 includes an L-shaped folding foot trench 221a. The folding foot trench 221a of the alignment socket 221 corresponds to the folding foot part 124a of the alignment protrusion 124 to reduce the possibility of relatively rotation produced between the chip 210 and the redistribution structure 220 while placing the chip 210.

In this embodiment, the socket sidewall 221b of the alignment socket 221 is vertical to the chip connecting surface 220a, and the disclosure is not limited thereto.

In this embodiment, the socket depth 221c of the alignment socket 221 is greater than or equal to 3 μm, and the disclosure is not limited thereto.

In this embodiment, there is a second spacing interval d2 between the alignment socket 221 and the chip bonding area 220b, and the second spacing interval is smaller than or equal to 10 μm, and the disclosure is not limited thereto.

Figure 2D:
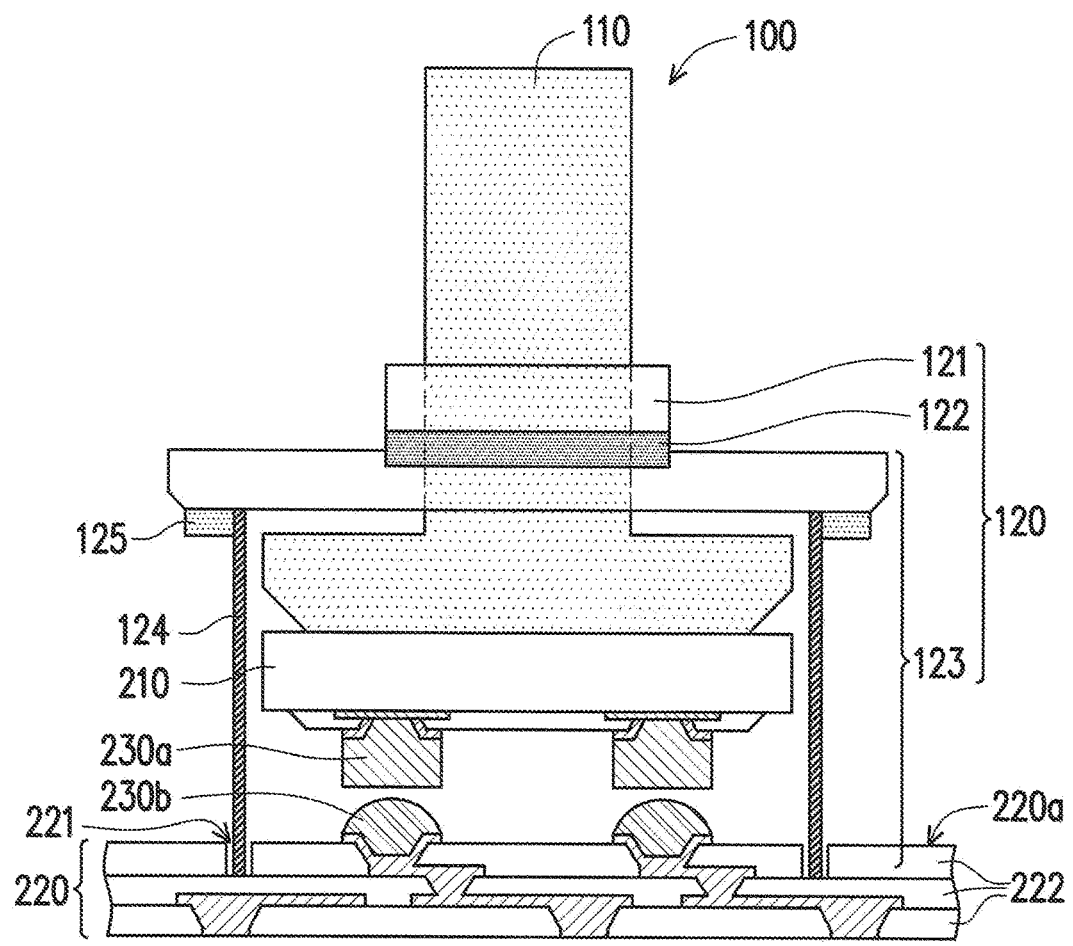

After that, please refer to FIG. 2D. The alignment protrusion 124 of the chip bonding apparatus 100 after picking up the chip 210 aligns with the alignment socket 221 of the redistribution structure 220. For example, the alignment module 120 slips along the axial part 112 toward the redistribution structure 220. If the alignment protrusion 124 contacts with the alignment socket 221 and confirms the location of the chip 210, the force sensor 122 receives corresponding counterforce produced by contact, transmits the corresponding force signal to drive the alignment module 120 to slip along the axial part 112 away from the redistribution structure 220, and starts with steps of placing the chip 210. In contrast, if the alignment protrusion 124 does not contact with the alignment socket 221 and/or confirm that the chip 210 is dislocated, the force sensor 122 transmits another corresponding force signal to not only drive the alignment module 120 to slip along the axial part 112 away from the redistribution structure 220, but also drive the chip bonding apparatus 100 after picking up the chip 210 to move in a direction parallel to the chip connecting surface 220a to carry out another round of alignment correction.

In some embodiments, after confirming that the location of the chip 210 is correct, the alignment module 120 may slip along the axial part 112 toward the redistribution structure 220, and carries out placing steps of the chip 210.

In some embodiments, after confirming that location of the placed chip 210 is correct, the alignment module 120 may slip along the axial part 112 away from the redistribution structure 220, and carries out the placing steps of the chip 210 at the same time.

In some embodiments, with the rapid scanning of the optical sensor 125 on the chip connecting surface 220a, the location where the chip 210 is placed may be confirmed before placing the chip 210.

In some embodiments, with the rapid scanning of the optical sensor 125 on the chip connecting surface 220a, the location where the chip 210 is placed may constantly be confirmed while placing the chip 210. For example, while placing the chip 210, if the optical sensor 125 may detect the location where the chip 210 offsets, the placing steps of the chip 210 stop or pause, and the chip bonding apparatus 100 after picking up the chip 210 moves in a direction parallel to the chip connecting surface 220a to carry out another alignment correction.

In some embodiments, the optical sensor 125 may scan the alignment socket 221 located on the chip connecting surface 220a. For instance, the optical sensor 125 may scan the pattern and/or the depth of the alignment socket 221. Since the alignment socket 221 has a fixed relative position relationship with the placing area of the chip 210, by scanning the alignment socket 221, the location where the chip 210 is placed may be confirmed.

Figure 2E:
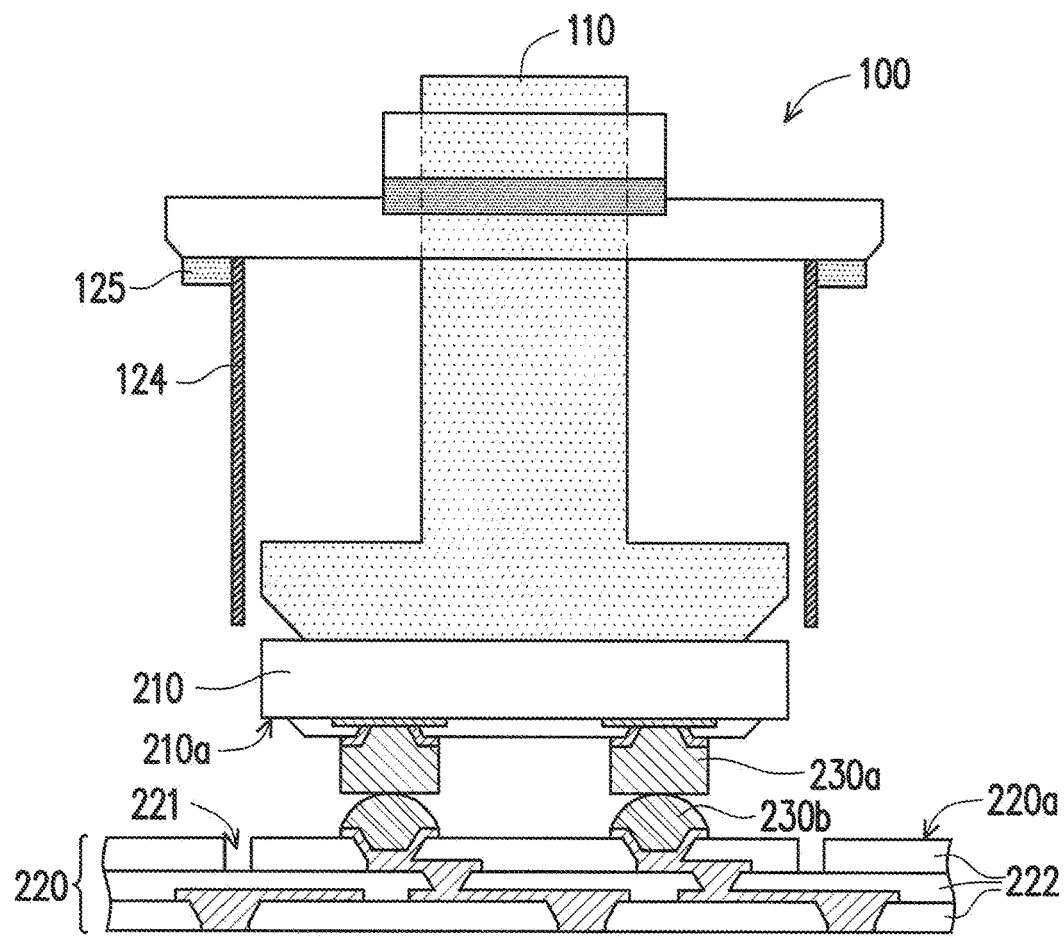

After that, please refer to FIG. 2E. The pick and place module 110 picking up the chip 210 moves towards the redistribution structure 220 to start placing the chip 210. The pick and place module 110 picking up the chip 210 moves toward the redistribution structure 220 so that the first conductive terminal 230a on the chip 210 directly contacts with the second conductive terminal 230b on the redistribution structure 220, and the chip 210 electrically connects with the redistribution structure 220 by the first conductive terminal 230a and the second conductive terminal 230b.

Figure 2F:
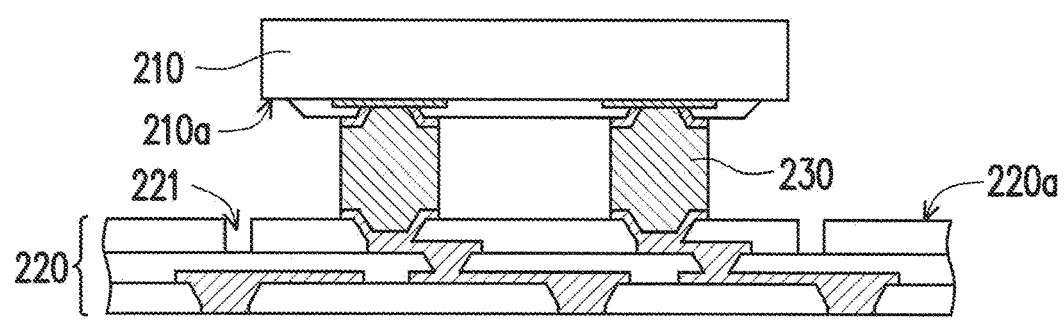

To follow up, please refer to FIG. 2F. With high-frequency induction hardening, reflowing, hot air heating, or other suitable welding process, the first conductive terminal 230a welds with the second conductive terminal 230b and forms the conductive connector 230 connecting between the chip 210 and the redistribution structure 220. After forming the conductive connector 230, the chip 210 electrically connecting to the redistribution structure 220 separates from the pick and place module 110. It is noted that to maintain the connection stability between the chip 210 and the redistribution structure 220, based on manufacturing needs, after forming the conductive connector 230 and any other steps after that, the chip 210 electrically connecting to the redistribution structure 220 then separates from the pick and place module 110.

Figure 2G:
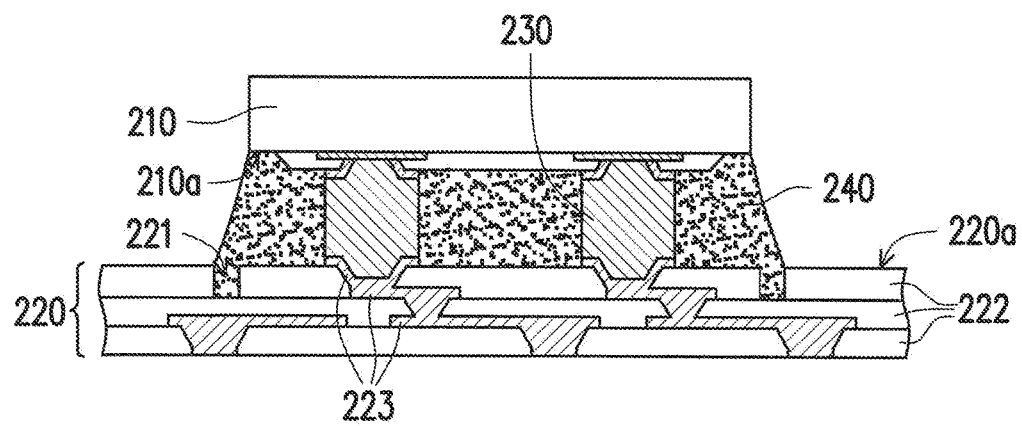

Then, please refer to FIG. 2G. An underfill 240 is formed between the chip 210 and the redistribution structure 220. The underfill 240 encapsulates an active surface 210a of the chip 210, part of the chip connecting surface 220a of the redistribution structure 220 and the conductive connector 230 between the chip 210 and the redistribution structure 220 to improve the stability of the connection between the chip 210 and the redistribution structure 220. In some embodiments, the underfill 240 may reduce the possibility of moisture or oxygen directly contacting with the active surface 210a of the chip 210 and the conductive connector 230 to maintain good electrical conductivity between the chip 210 and the redistribution structure 220. In general, the underfill 240 includes a bonding material 241 (illustrated in FIG. 6B) and a filler 242 (illustrated in FIG. 6B). The filler 242 is distributed in the bonding material 241 and separates from each other. The bonding material 241 is, for example, silicone, epoxy, or other suitable polymers. The filler 242 is, for example, metal particles, metal oxide particles, carbon particles, or other suitable filling particles to improve adhesion of the underfill 240. Furthermore, the filler 242 can also be a thermal conductive particle to improve the thermal conductivity of the underfill 240.

Figure 6A:
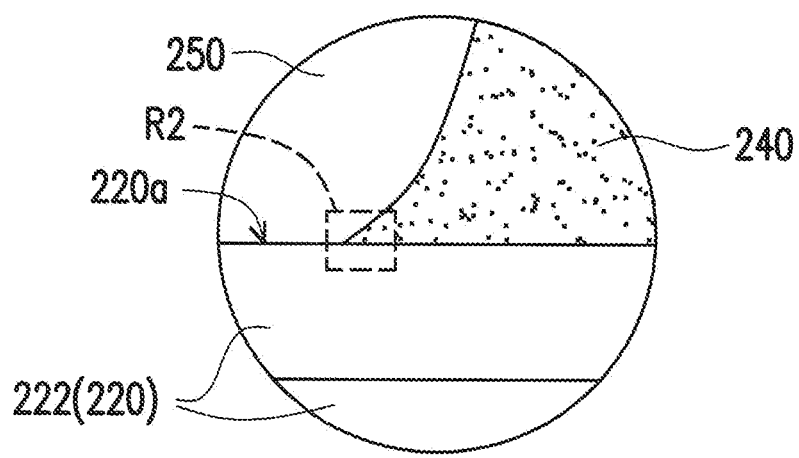
FIG. 6A is a partial cross-sectional schematic view illustrating the chip package structure according to an embodiment of the disclosure.
Figure 6B:
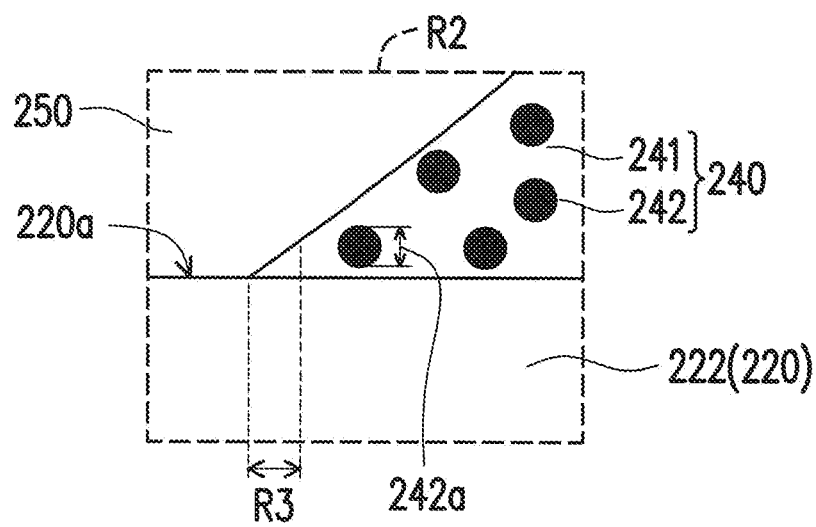
FIG. 6B is an enlarged view of Area R2 in FIG. 6A.

In this embodiment, the underfill 240 fills in at least one of the alignment socket 221 to reduce the possibility that the underfill 240 peels off from the chip connecting surface 220a of the redistribution structure 220. Please refer to FIG. 6A and FIG. 6B at the same time. FIG. 6A is a partial cross-sectional schematic view of the chip package structure 200 of an exemplary of this embodiment. FIG. 6B is an enlarged view of the Area R2 in FIG. 6A. In detail, FIG. 6A illustrates a cross-sectional schematic view that the underfill 240 directly encapsulates onto the chip connecting surface 220a of the redistribution structure 220 and does not fill in the area in the alignment socket 221. In FIG. 6B, in an edge area R3 where the dielectric layer 222 and the underfill 240 are in contact with each other on the chip connecting surface 220a of the redistribution structure 220, the thickness of the underfill 240 in area R3 is smaller than the particle width 242a of the filler 242, the filler 242 can not be distributed inside the bonding material 241 of the edge area R3. Therefore, compared with parts of the underfill 240 filled in the alignment socket 221, the underfill 240 disposed in the edge area R3 is more likely to peel off. In this embodiment, at least part of the underfill 240 is filled in the alignment socket 221 and stably connects to the redistribution structure 220. Therefore, even though parts of areas (e.g. edge area R3) are prone to peel off, the underfill 240 does not fully peel off from the chip connecting surface 220a of the redistribution structure 220. As such, in the bonding process of the chip 210, yield enhances.

Figure 2H:
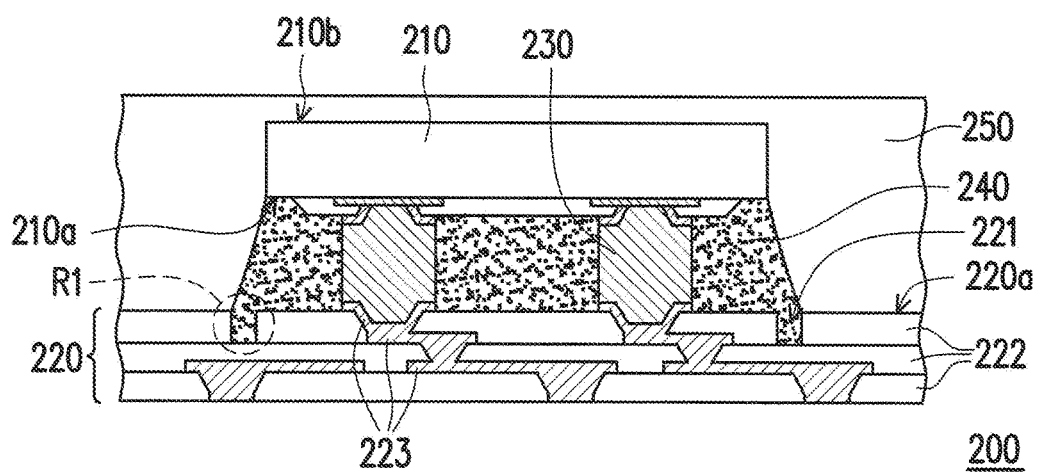

Then, please refer to FIG. 2H. The encapsulant 250 is formed on the chip connecting surface 220a of the redistribution structure 220 to encapsulate the redistribution structure 220, the underfill 240, and the chip 210. In general, the encapsulant 250 is a molding compound formed by a molding process. In some embodiments, the encapsulant 250 may be, for example, epoxy or other suitable resin insulation materials.

In this embodiment, the encapsulant 250 encapsulates on the backside surface 210b of the chip 210, and the disclosure is not limited thereto. In other embodiments, the encapsulant 250 may expose the backside surface 210b of the chip 210.

In this embodiment, the encapsulant 250 does not fill in the alignment socket 221, and the disclosure is not limited thereto. In other embodiments, the encapsulant 250 may partly fill in the alignment socket 221.

After the above-mentioned manufacturing process above, the manufacturing of the chip package structure 200 of this exemplary completes. As illustrated in FIG. 2H, it is a cross-sectional schematic view of the chip package structure of the first embodiment. The chip package structure 200 includes a chip 210, a redistribution structure 220, an underfill 240, and an encapsulant 250. An active surface 210a of the chip 210 and a chip connecting surface 220a of the redistribution structure 220 face with each other, and the chip 210 electrically connects with the redistribution structure 220 by the conductive connector 230. The redistribution structure 220 includes at least one socket (that is, the alignment socket 221) located onto the chip connecting surface 220a. The alignment socket 221 is an orientation recognition mark in the chip 210 bonding process, and the alignment socket 221 does not overlap with the chip 210. The underfill 240 is disposed between the chip 210 and the redistribution structure 220, and the underfill 240 at least fills in part of the alignment socket 221. The encapsulant 250 encapsulates the chip 210, the redistribution structure 220, and the underfill 240.

In this embodiment, the amount of the alignment socket 221 is plural and is separated from each other. The pattern formed by the plurality of alignment sockets 221 surrounding the chip 210, and the disclosure is not limited thereto. In other embodiments, the alignment socket 221 may be an annular socket, and the annular socket surrounds the chip 210.

In this embodiment, the alignment socket 221 is configured in a non-point symmetry manner. In other words, on a virtual plane (e.g. paper plane in FIG. 2C) parallel to the chip connecting surface 220a, the corresponding pattern of the alignment socket 221 does not have a symmetric point.

Figure 3:
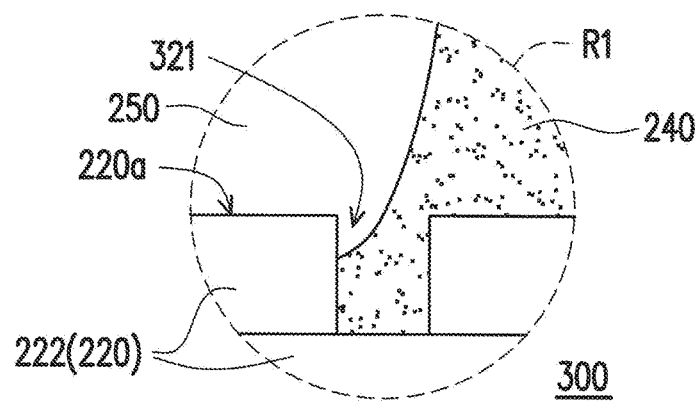
FIG. 3 is a partial cross-sectional schematic view illustrating a chip package structure according to the second embodiment of the disclosure.

FIG. 3 is a partial cross-sectional schematic view illustrating a chip package structure according to the second embodiment of the disclosure. The partial area of the chip package structure 300 illustrated in FIG. 3 corresponds to the first area R1 of the chip package structure 200 illustrated in FIG. 2H. Please refer to FIG. 3. In this embodiment, the chip package structure 300 is similar to the chip package structure 200. The same reference numerals represent the similar structures and have similar functions, and the same technical content is omitted from explanation. However, the main difference between the chip package structure 300 and the chip package structure 200 is that the underfill 240 and the encapsulant 250 may fill in the same alignment socket 321.

Figure 4:
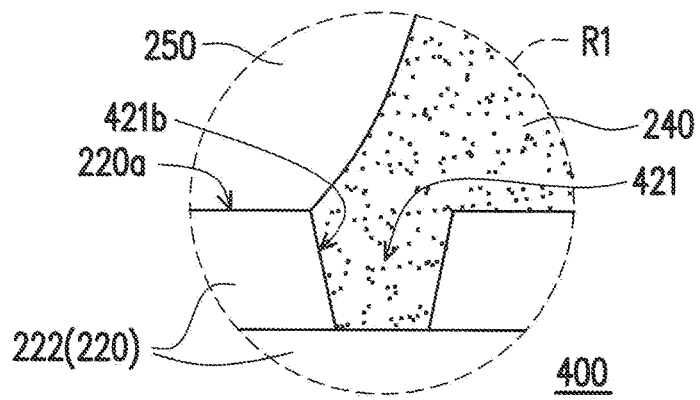
FIG. 4 is a partial cross-sectional schematic view illustrating the chip package structure according to the third embodiment of the disclosure.

FIG. 4 is a partial cross-sectional schematic view illustrating the chip package structure according to the third embodiment of the disclosure. The partial area R1 of the chip package structure 400 illustrated in FIG. 4 corresponds to the first area R1 of the package structure 200 illustrated in FIG. 2H. Please refer to FIG. 4. In this embodiment, the chip package structure 400 is similar to the chip package structure 200. The same reference numerals represent the similar structures and have similar functions, and the same technical content is omitted from explanation. However, the main difference between the chip package structure 400 and the chip package structure 200 is that the sidewall of an alignment socket 421b and a chip connecting surface 220a of the redistribution structure 220 are not vertical. In this embodiment, the encapsulant 250 does not fill in the alignment socket 421, and the disclosure is not limited thereto. In other embodiments, the encapsulant 250 may partially fill in the alignment socket 421.

Figure 5:
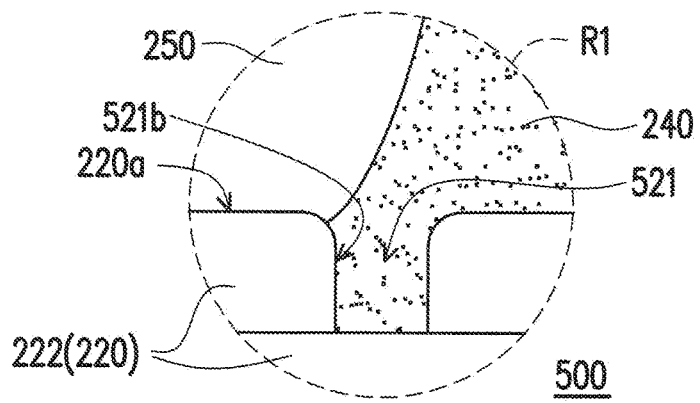
FIG. 5 is a partial cross-sectional schematic view illustrating a chip package structure according to the fourth embodiment of the disclosure.

FIG. 5 is a partial cross-sectional schematic view illustrating a chip package structure according to an exemplary of the fourth embodiment of the disclosure. The partial area of a chip package structure 500 illustrated in FIG. 5 corresponds to the first area R1 of the chip package structure 200 illustrated in FIG. 2H. Please refer to FIG. 5. In this embodiment, the chip package structure 500 is similar to the chip package structure 200. The same reference numerals represent the similar structures and have similar functions, and the same technical content is omitted from explanation. However, the main difference between the chip package structure 500 and the chip package structure 200 is that the dielectric layer 222 between the sidewall 521b of the alignment socket 521 and the chip connecting surface 220a of the redistribution structure 220 has a round corner. In this embodiment, the encapsulant 250 does not fill in the alignment socket 521, and the disclosure is not limited thereto. In other embodiments, the encapsulant 250 may partially fill in the alignment socket 521.

Figure 7:
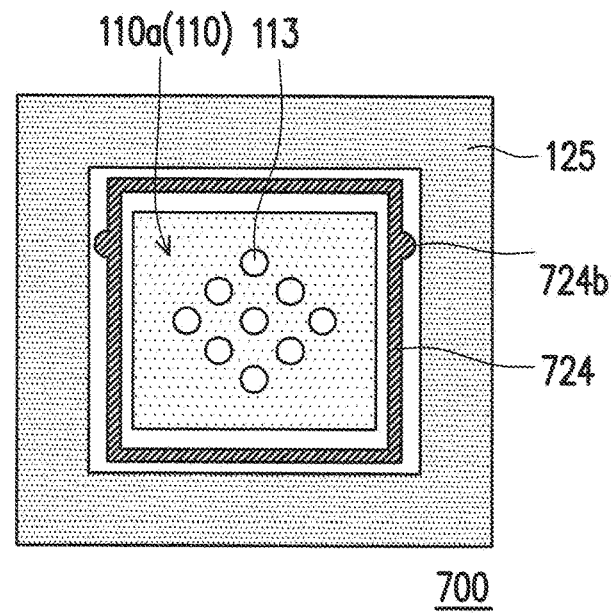
FIG. 7 is a schematic bottom view illustrating the chip bonding apparatus according to an exemplary of the fifth embodiment of the disclosure.

FIG. 7 is a schematic bottom view illustrating the chip bonding apparatus according to the fifth embodiment of the disclosure. Please refer to FIG. 7. In this embodiment, a chip bonding apparatus 700 is similar to the chip bonding apparatus 100. The same reference numerals represent the similar structures and have similar functions, and the same technical content is omitted from explanation. However, the main difference between the chip bonding apparatus 700 and the chip bonding apparatus 100 is that an alignment protrusion 724 of the chip bonding apparatus 700 is an annular protrusion, and the annular protrusion surrounds the pick and place module 110.

In this embodiment, the alignment protrusion 724 has at least one of the alignment protrusion point 724b so that the alignment protrusion 724 is configured in a non-point symmetry manner.

Figure 8:
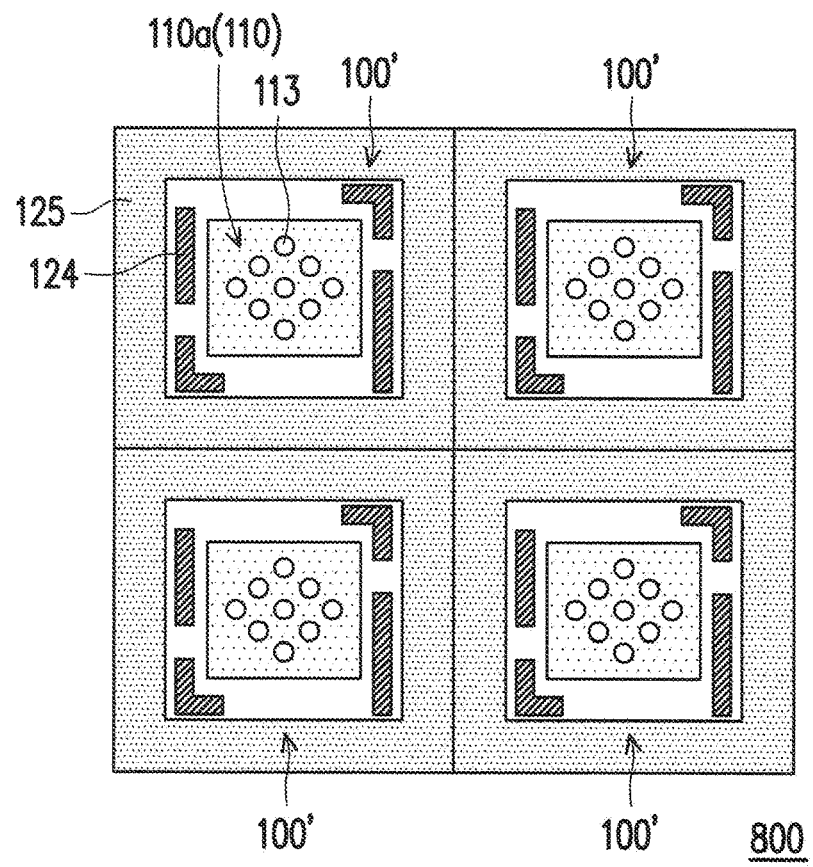
FIG. 8 is a schematic bottom view illustrating the chip bonding apparatus according to the sixth embodiment of the disclosure.

FIG. 8 is a schematic bottom view illustrating the chip bonding apparatus according to the sixth embodiment of the disclosure. Please refer to FIG. 8. In this embodiment, a chip bonding apparatus 800 is similar to the chip bonding apparatus 100. The same reference numerals represent the similar structures and have similar functions, and the same technical content is omitted from explanation. However, the main difference between the chip bonding apparatus 800 and the chip bonding apparatus 100 is that the chip bonding apparatus 800 may include a plurality of chip bonding units 100'. A single chip bonding unit 100' is similar to the chip bonding apparatus 100. That is, the single chip bonding unit 100' has its own pick and place module 110 and the alignment module 120. A plurality of the chip bonding units 100' link to each other by mechanical device or signal control to improve manufacturing throughput. In this embodiment, the amount of the chip bonding unit 100' takes four as an example and is an array arrangement, and the disclosure is not limited thereto.

Figure 9:
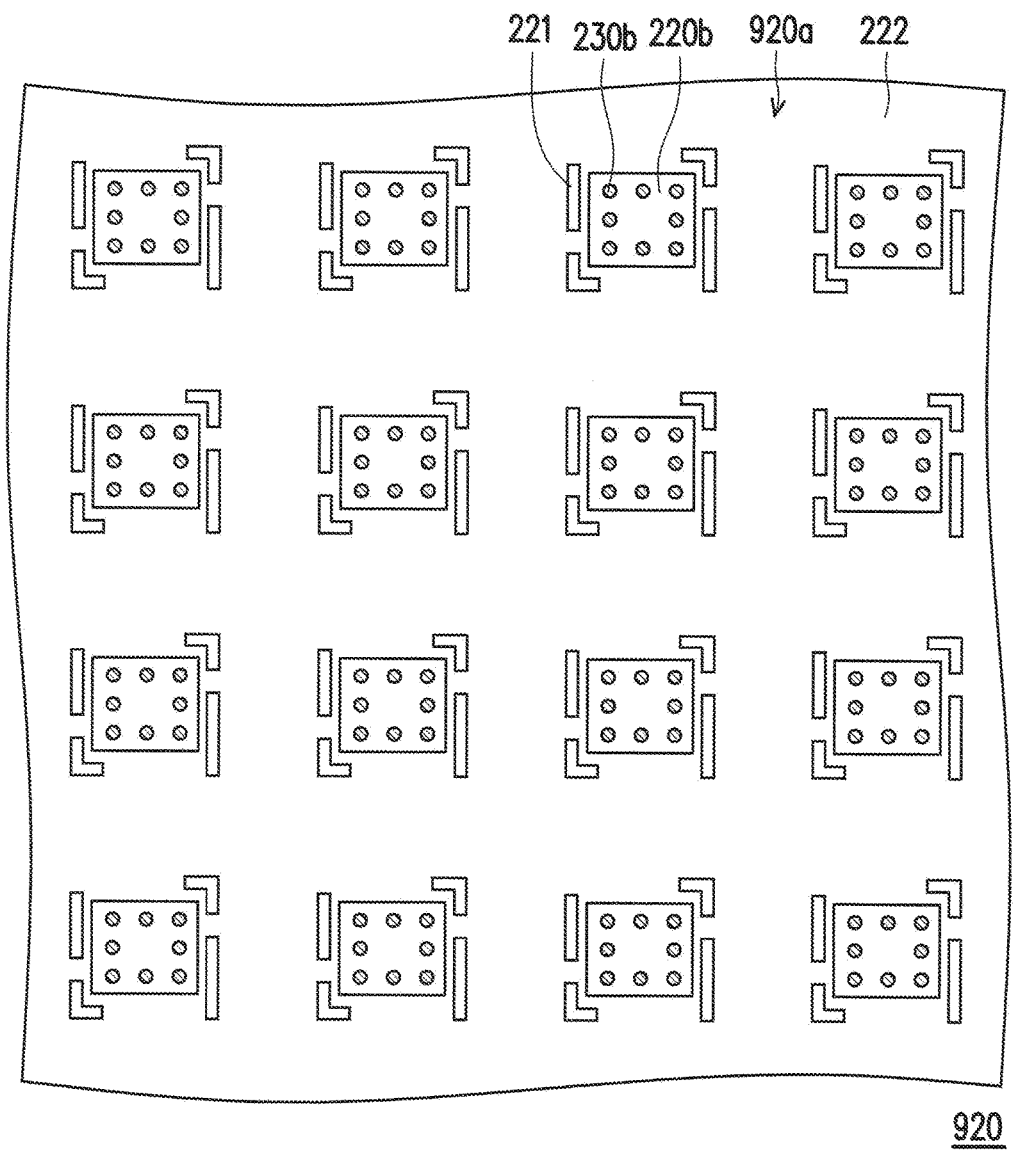
FIG. 9 is a schematic top view illustrating a redistribution structure according to the chip bonding method of the seventh embodiment of the disclosure.

FIG. 9 is a schematic top view illustrating a redistribution structure according to the chip bonding method of the seventh embodiment of the disclosure. Please refer to FIG. 9. In this embodiment, a redistribution structure 920 is similar to the redistribution structure 220. The same reference numerals represent the similar structures and have similar functions, and the same technical content is omitted from explanation. However, the main difference between the redistribution structure 920 and the redistribution structure 220 is that there are a plurality of chip bonding areas 220b on the chip connecting surface 920a of a redistribution structure 920. Every chip bonding area 220b has a corresponding plurality of the second conductive terminal 230b and at least one of the alignment socket 221, and may bond to each other with a plurality of the chip 210 and align in the bonding process.

In this embodiment, a singulation process (such as cutting process) may be performed after the chip 210 and the redistribution structure 920 are bonded to each other, to form a chip package structure with a single chip 210 similar to that shown in FIG. 2H.

In summary, the chip bonding apparatus of this embodiment having at least one alignment protrusion improves alignment accuracy of the chip bonding process and thus enhances product yield. The chip bonding method of the embodiment of the disclosure is that the chip bonding apparatus having at least alignment protrusion is bounded onto the redistribution structure having at least one alignment socket. The chip bonding process thus has better accuracy and has better yield. The chip package structure of an embodiment of the disclosure has the redistribution structure having at least one alignment socket, and at least one of the encapsulant and the underfill fills in the alignment socket. Therefore, the manufacturing process has better accuracy, and products have better yield.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip bonding apparatus for bonding a chip and a redistribution structure with each other, the chip bonding apparatus comprising:
   a pick and place module, suitable for picking up and placing the chip; and
   an alignment module, moveably connected to the pick and place module, and the alignment module comprising at least one alignment protrusion, wherein the at least one alignment protrusion extends towards at least one alignment socket included in the redistribution structure, and the at least one alignment socket is configured in a non-point symmetry manner.

2. The chip bonding apparatus according to claim 1, wherein the alignment module further comprises a force sensor disposed between the pick and place module and the at least one alignment protrusion.

3. The chip bonding apparatus according to claim 1, wherein the alignment module further comprises at least one optical sensor surrounded the at least one alignment protrusion and the pick and place module.

4. The chip bonding apparatus according to claim 1, wherein on a direction of the pick and place module picks and places the chip, the at least one alignment protrusion and the pick and place module do not overlap.

5. The chip bonding apparatus according to claim 1, wherein the at least one alignment protrusion comprises a plurality of alignment protrusions separated from each other.

6. The chip bonding apparatus according to claim 1, wherein the at least one alignment protrusion comprises at least one annular protrusion surrounded the pick and place module.

7. The chip bonding apparatus according to claim 1, wherein the at least one alignment protrusion is distributed corresponding to the at least one alignment socket.

8. A chip bonding method comprising:
provuiding the chip bonding apparatus according to claim 1;
picking up the chip with the pick and place module of the chip bonding apparatus;
moving the chip bonding apparatus to the above of the redistribution structure so that the picked-up chip has a spacing interval with the redistribution structure;
aligning the at least one alignment protrusion with the at least one alignment socket of the redistribution structure; and
moving the pick and place module with the chip toward the redistribution structure so that the chip and the redistribution structure electrically connect to each other.

9. The chip bonding method according to claim 8, wherein the step of aligning the at least one alignment protrusion with the at least one alignment socket comprises:
moving the alignment module toward the redistribution structure so that the at least one alignment protrusion extending toward the redistribution structure inserts the at least one alignment socket.

10. The chip bonding method according to claim 8, wherein the alignment module further comprises an optical sensor, and the step of aligning the at least one alignment protrusion with the at least one alignment socket comprises aligning by the optical sensor.

11. The chip bonding method according to claim 10, wherein the step of aligning the at least one alignment protrusion with the at least one alignment socket of the redistribution structure is performed before the step of moving the pick and place module for picking up the chip toward the redistribution structure.

12. The chip bonding method according to claim 10, wherein the step of aligning the at least one alignment protrusion with the at least one alignment socket of the redistribution structure is performed simultaneously with the step of moving the pick and place module for picking up the chip toward the redistribution structure.

13. The chip bonding method according to claim 8, further comprising:
separating the chip electrically connecting to the redistribution structure and the pick and place module from each other.

14. A chip package structure comprising:
a chip;
a redistribution structure, electrically connecting to the chip, and the redistribution structure comprising at least one socket not overlapping with the chip, wherein the at least one socket is configured in a non-point symmetry manner;
an underfill, disposed between the chip and the redistribution structure; and
an encapsulant, encapsulating the chip, the redistribution structure, and the underfill, wherein at least one of the encapsulant and the underfill fill in the at least one socket.

15. The chip package structure according to claim 14, wherein the at least one socket is a blind via and/or a trench not penetrating through the redistribution structure.

16. A chip package structure comprising:
a chip;
a redistribution structure, electrically connecting to the chip, and the redistribution structure comprising at least one orientation recognition mark, wherein the at least one orientation recognition mark is configured in a non-point symmetry manner;
an underfill, disposed between the chip and the redistribution structure; and
an encapsulant, encapsulating the chip, the redistribution structure, and the underfill, wherein at least one of the encapsulant and the underfill encapsulates the at least one orientation recognition mark.

17. The chip package structure according to claim 16, wherein the at least one orientation recognition mark is located onto the surface of the redistribution structure facing the chip.

18. The chip package structure according to claim 16, wherein the at least one orientation recognition mark is located in a recess extending inward from the surface of the redistribution structure.

* * * * *